United States Patent
Chen (10) Patent No.: US 7,372,730 B2
(45) Date of Patent: May 13, 2008

(54) METHOD OF READING NAND MEMORY TO COMPENSATE FOR COUPLING BETWEEN STORAGE ELEMENTS

(75) Inventor: Jian Chen, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 132 days.

(21) Appl. No.: 10/765,693

(22) Filed: Jan. 26, 2004

(65) Prior Publication Data

US 2005/0162913 A1    Jul. 28, 2005

(51) Int. Cl.
G11C 16/04    (2006.01)
(52) U.S. Cl. .................... 365/185.02; 365/185.03; 365/185.17; 365/185.22; 365/185.25
(58) Field of Classification Search ........... 365/185.02, 365/185.03, 185.09, 185.17, 185.2, 185.25, 365/185.22
See application file for complete search history.

(56) References Cited

U.S. PATENT DOCUMENTS

| | | | | |
|---|---|---|---|---|
| 5,120,671 A * | 6/1992 | Tang et al. ................. 438/257 |
| 5,467,306 A | 11/1995 | Kaya et al. ............... 365/185.2 |
| 5,761,222 A | 6/1998 | Baldi ......................... 714/773 |
| 5,867,429 A | 2/1999 | Chen et al. ............. 365/185.33 |
| 5,991,202 A | 11/1999 | Derhacobian et al. . 365/185.19 |
| 6,061,270 A | 5/2000 | Choi ....................... 365/185.02 |
| 6,134,141 A | 10/2000 | Wong ..................... 365/185.03 |
| 6,154,391 A | 11/2000 | Takeuchi et al. ....... 365/185.24 |
| 6,175,522 B1 | 1/2001 | Fang ..................... 365/185.18 |
| 6,228,782 B1 | 5/2001 | Fang et al. ................. 438/400 |
| 6,240,016 B1 | 5/2001 | Haddad et al. ........ 365/185.18 |
| 6,380,033 B1 | 4/2002 | He et al. ..................... 438/258 |
| 6,424,566 B1 | 7/2002 | Parker ................... 365/185.03 |
| 6,456,528 B1 | 9/2002 | Chen ..................... 365/185.03 |
| 6,469,933 B2 | 10/2002 | Choi et al. ............. 365/185.17 |
| 6,490,200 B2 | 12/2002 | Cernea et al. ......... 365/185.21 |
| 6,493,265 B2 | 12/2002 | Satoh et al. ........... 365/185.21 |
| 6,522,580 B2 | 2/2003 | Chen et al. ............ 365/185.02 |
| 6,529,412 B1 | 3/2003 | Chen et al. ............ 365/185.21 |
| 6,542,407 B1 | 4/2003 | Chen et al. ............ 365/185.17 |
| 6,570,785 B1 | 5/2003 | Mangan et al. ........ 365/185.02 |
| 6,999,344 B2 * | 2/2006 | Hosono et al. ........ 365/185.17 |
| 2002/0118574 A1 | 8/2002 | Gongwer et al. ...... 365/185.28 |
| 2003/0002348 A1 | 1/2003 | Chen et al. ............ 365/189.01 |

FOREIGN PATENT DOCUMENTS

EP    1 271 553    1/2003

\* cited by examiner

*Primary Examiner*—Andrew Q. Tran
(74) *Attorney, Agent, or Firm*—Vierra Magen Marcus & DeNiro LLP (57) ABSTRACT

A method for reading a non-volatile memory arranged in columns and rows which reduces adjacent cell coupling, sometimes referred to as the Yupin effect. The method includes the steps of: selecting a bit to be read in a word-line; reading an adjacent word line written after the word line; and reading the selected bit in the word line by selectively adjusting at least one read parameter. In one embodiment, the read parameter is the sense voltage. In another embodiment, the read parameter is the pre-charge voltage. In yet another embodiment, both the sense and the pre-charge voltage are adjusted.

25 Claims, 9 Drawing Sheets

METHOD OF READING NAND MEMORY TO COMPENSATE FOR COUPLING BETWEEN STORAGE ELEMENTS

BACKGROUND OF THE INVENTION

1. Field of the Invention

This invention relates generally to a non-volatile memory and its operation, and, more specifically, to techniques for reducing the effects of data stored in one memory storage element upon data read from other storage elements.

2. Description of the Related Art

Electrical Erasable Programmable Read Only Memory (EEPROM) and flash memory are among the most popular non-volatile semiconductor memories. They are used in cellular telephones, digital cameras, personal digital assistants, mobile computing devices, non-mobile computing devices, desktop computers and other devices.

Typical EEPROMs and flash memories utilize a memory cell with a floating gate that is provided above and insulated from a channel region in a semiconductor substrate. The floating gate is positioned above and between source and drain regions. A control gate is provided over and insulated from the floating gate. The threshold voltage of the memory is controlled by the amount of charge that is retained on the floating gate. That is, the minimum amount of voltage that must be applied to the control gate before the memory cell is turned on to permit conduction between its source and drain is controlled by the level of charge on the floating gate.

Some EEPROM and flash memory devices have a floating gate that is used to store two ranges of charges and, therefore, the memory cell can be programmed/erased between two states. Typically, the program voltage applied to the control gate is applied as a series of pulses. In the periods between the pulses, verify operations are carried out. Conduction represents an "on" state of the device corresponding to the flow of current across the channel of the device. An "off" state corresponds to no current flowing across the channel between the source and drain. Typically, a flash memory cell will conduct if the voltage being applied to the control gate is greater than the threshold voltage and the memory cell will not conduct if the voltage applied to the control gate is less than the threshold voltage. By setting the threshold voltage of the cell to an appropriate value, the cell can be made to either conduct or not conduct current for a given set of applied voltages. Thus, by determining whether a cell conducts current at a given set of applied voltages, the state of the cell can be determined.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted, the memory cell will turn on to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate) now being included in commercial products. More storage states, such as 16 states per storage element, are contemplated. Each floating gate transistor has a certain total range (window) of threshold voltages in which it may practically be operated, and that range is divided into the number of states defined for it plus margins between the states to allow for them to be clearly differentiated from one another.

Relevant examples of NAND type flash memories and their operation are provided in the following U.S. Patents/Patent Applications, all of which are incorporated herein by reference in their entirety: U.S. Pat. Nos. 5,570,315; 5,774, 397, 6,046,935, 6,456,528 and U.S. patent application Ser. No. 09/893,277 (Publication No. US2003/0002348). Other types of flash memory devices can also be used with the present invention. For example, the following patents describe NOR type flash memories and are incorporated herein by reference in their entirety: U.S. Pat. Nos. 5,095, 344; 5,172,338; 5,890,192 and 6,151,248. Another example of a flash memory type is found in U.S. Pat. No. 6,151,248, incorporated herein by reference in its entirety.

Field effect coupling between adjacent floating gates is described in U.S. Pat. No. 5,867,429 of Jian Chen and Yupin Fong, which patent is incorporated herein in its entirety by this reference. The degree of this coupling is necessarily increasing as the sizes of memory cell arrays are being decreased as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appears to be different than programmed because of the effect of the charge on the second set of floating gates being coupled with the first. This is known as the Yupin effect. Aforementioned U.S. Pat. No. 5,867,429 suggests either physically isolating the two sets of floating gates from each other, or taking into account the effect of the charge on the second set of floating gates when reading that of the first.

The Yupin effect is present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and U.S. Ser. No. 09/505,555, filed Feb. 17, 2000, and Ser. No. 09/667,344, filed Sep. 22, 2000.

A NAND array of one design has a number of memory cells, such as 8, 16, 32, or even 64 connected in series string between a bit line and a reference potential through select transistors at either end. Word lines are connected with control gates of cells in different series strings. Relevant examples of such arrays and their operation are given in the following U.S. patents and pending application of Toshiba that are incorporated herein in their entirety by this reference: U.S. Pat. Nos. 5,570,315, 5,774,397 and 6,046,935, and U.S. Ser. No. 09/667,610.

One measure of the magnitude of word-line-to-word-line coupling is in the distributions of the threshold voltages of a number of cells in the array. This coupling will have the effect of broadening the distribution of the threshold voltages of cells in the array, reducing the ability of designers to increase the speed and reliability of devices. Any method which therefore reduces the distribution will be beneficial to memory devices.

SUMMARY OF THE INVENTION

The present invention, roughly described, pertains to a method for reducing the effects of adjacent cell coupling in memory devices. In one aspect, the invention is a method for reading non-volatile memory arranged in columns and rows. In a first aspect, the method includes the steps of: selecting a bit to be read in a word-line WLn; reading an adjacent word line (WLn+1) written after word line WLn; and reading the selected bit in word line WLn by selectively adjusting at least one read parameter.

In one embodiment, the read parameter is the sense voltage. In another embodiment, the read parameter is the pre-charge voltage. In yet another embodiment, both the sense and the pre-charge voltage are adjusted.

In another embodiment, the invention is a method for reading non-volatile memory arranged in columns and rows. In this embodiment, the method includes the steps of: determining a selected word-line to be read; reading an adjacent word line written after the first word line; determining whether a bit adjacent to the selected bit has a threshold voltage greater than a check value; and, if the selected bit has a threshold voltage greater than the check value, reading the selected bit in word line by selectively adjusting at least one read parameter.

In yet another embodiment, the invention is a memory system including code enabling reading data from the system. The system includes an array of multi-state memory cells arranged in rows and columns and a controller executing said code. The code performs the steps of: determining a selected bit to be read in a first row-line; reading an adjacent row line written after the first row line; determining whether a bit adjacent to the selected bit has a threshold voltage greater than a check value; and reading the selected bit in row line by selectively adjusting at least one read parameter if the selected bit has a threshold voltage greater than the check value, In yet another embodiment, the invention is an apparatus. The invention includes means for determining a selected bit to be read in a first word-line and means for reading an adjacent word line written after the first word line. In addition means for determining whether a bit adjacent to the selected bit has a threshold voltage greater than a check value are provided. Finally, a means for reading the selected bit in word line by selectively adjusting at least one read parameter if the selected bit has a threshold voltage greater than the check value is included.

These and other objects and advantages of the present invention will appear more clearly from the following description in which the preferred embodiment of the invention has been set forth in conjunction with the drawings.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

A method for reading a memory device which reduces the Yupin effect on adjacent cells is described herein. An exemplary memory device is discussed below and the method may be utilized on such device. However, the method may be performed on many other types of devices and is not limited to the particular device described herein.

Figure 1:
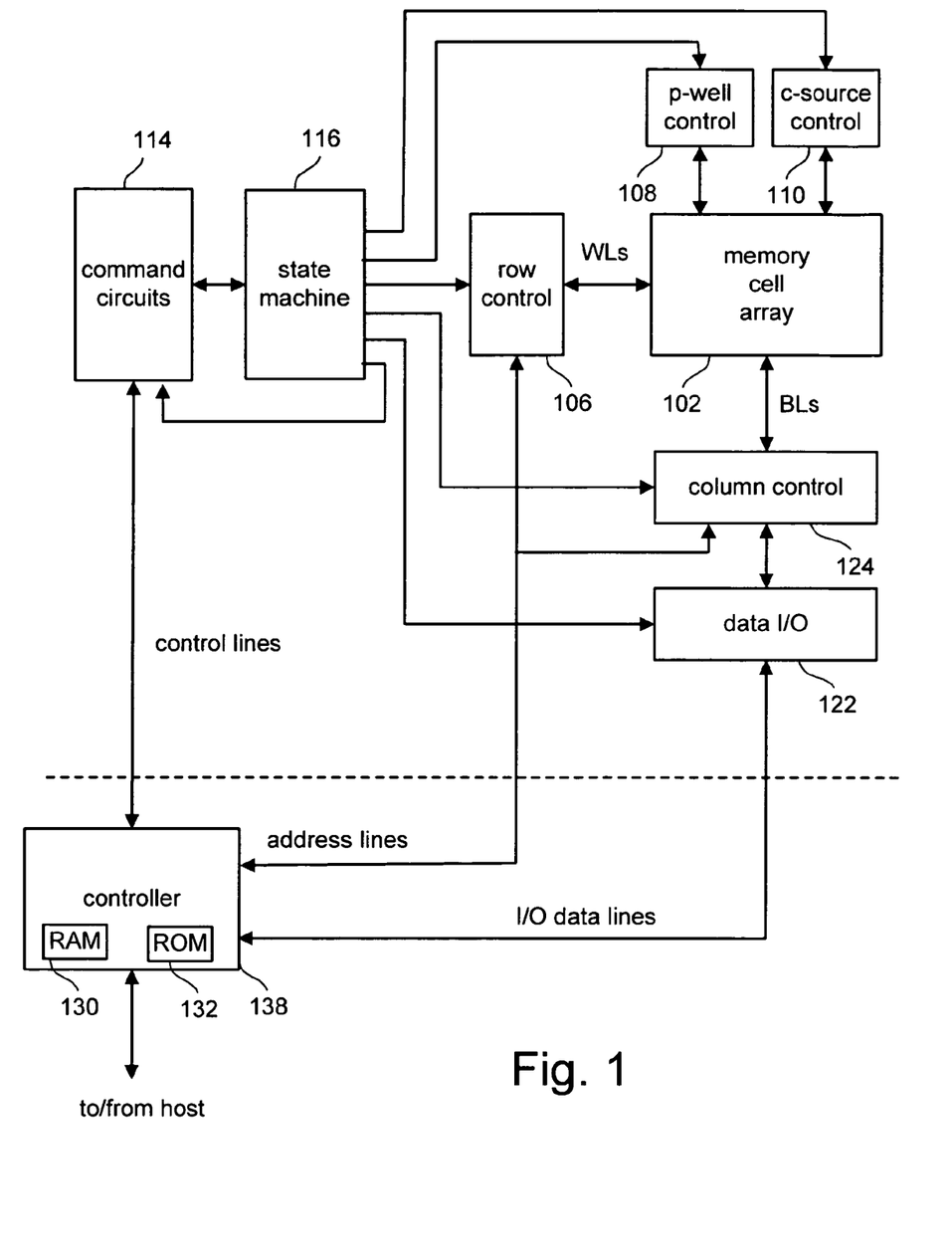
FIG. 1 is a block diagram of one embodiment of a non-volatile memory system in which the various aspects of the present invention are implemented.

FIG. 1 is a block diagram of one embodiment of a flash memory system that can be used to implement the present invention. Memory cell array 102 is controlled by column control circuit 124, row control circuit 106, c-source control circuit 110 and p-well control circuit 108. Column control circuit 124 is connected to the bit lines of memory cell array 102 for reading data stored in the memory cells, for determining a state of the memory cells during a program operation, and for controlling potential levels of the bit lines to promote the programming or to inhibit the programming. Row control circuit 106 is connected to the word lines to select one of the word lines, to apply read voltages, to apply program voltages and to apply an erase voltage. C-source control circuit 110 controls a common source line (labeled as "C-source" in FIG. 2) connected to the memory cells. P-well control circuit 108 controls the p-well voltage.

The data stored in the memory cells are read out by the column control circuit 124 and are output to external I/O lines via data input/output buffer 122. Program data to be stored in the memory cells are input to the data input/output buffer 122 via the external I/O lines, and transferred to the column control circuit 104. The external I/O lines are connected to controller 118.

Command data for controlling the flash memory device is input to controller 138. The command data informs the flash memory of what operation is requested. The input command is transferred to state machine 116, which controls column control circuit 124, row control circuit 106, c-source control 110, p-well control circuit 108 and data input/output buffer 122. State machine 116 can also output status data of the flash memory such as READY/BUSY or PASS/FAIL.

Controller 138 is connected or connectable with a host system such as a personal computer, a digital camera, personal digital assistant, etc. Controller 138 communicates with the host in order to receive commands from the host, receive data from the host, provide data to the host and provide status information to the host. Controller 138 converts commands from the host into command signals that can be interpreted and executed by command circuits 114, which is in communication with state machine 116. Controller 138 typically contains buffer memory for the user data being written to or read from the memory array.

One exemplary memory system comprises one integrated circuit that includes controller 138, and one or more integrated circuit chips that each contain a memory array and associated control, input/output and state machine circuits. In one embodiment, the memory arrays and controller circuit are together on one integrated circuit chip. The memory system may be embedded as part of the host system, or may be included in a memory card (or other package) that is removably inserted into the host systems. Such a removable card may include the entire memory system (e.g. including the controller) or just the memory array(s) and associated peripheral circuits (with the Controller being embedded in the host). Thus, the controller can be embedded in the host or included within a removable memory system.

Figure 2:
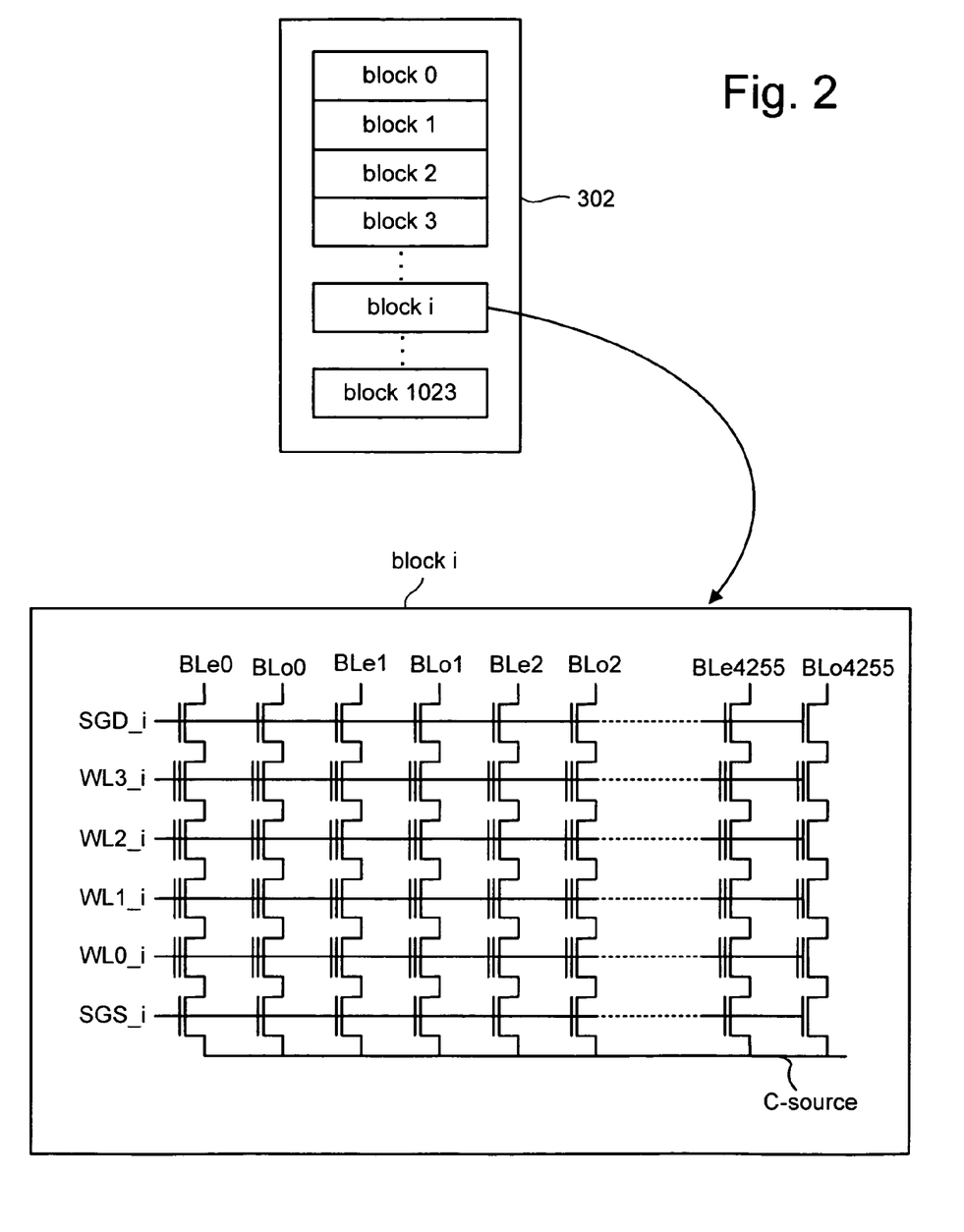
FIG. 2 illustrates an example of an organization of a memory array.

FIG. 2 shows an example structure of memory cell array 302. As one example, a NAND flash EEPROM is described that is partitioned into 1,024 blocks. In one embodiment, the data stored in each block is simultaneously erased. In other embodiments, the unit of erase is different than a block. For example, a block can refer to a minimum unit of cells for performing a read operation, a minimum unit of cells for performing a programming operation, a grouping of physically continuous/neighboring memory cells, or another grouping of cells that has some logic for the grouping.

In each block, in the example of FIG. 2, there are 8,512 columns that are divided into even columns and odd columns. The bit lines are also divided into even bit lines (BLe) and odd bit lines (BLo). FIG. 2 shows four memory cells connected in series to form a NAND string. Although four cells are shown to be included in each NAND string, more or less than four can be used. One terminal of the NAND string is connected to corresponding bit line via a first select transistor SGD, and another terminal is connected to c-source via a second select transistor SGS.

Figure 3:
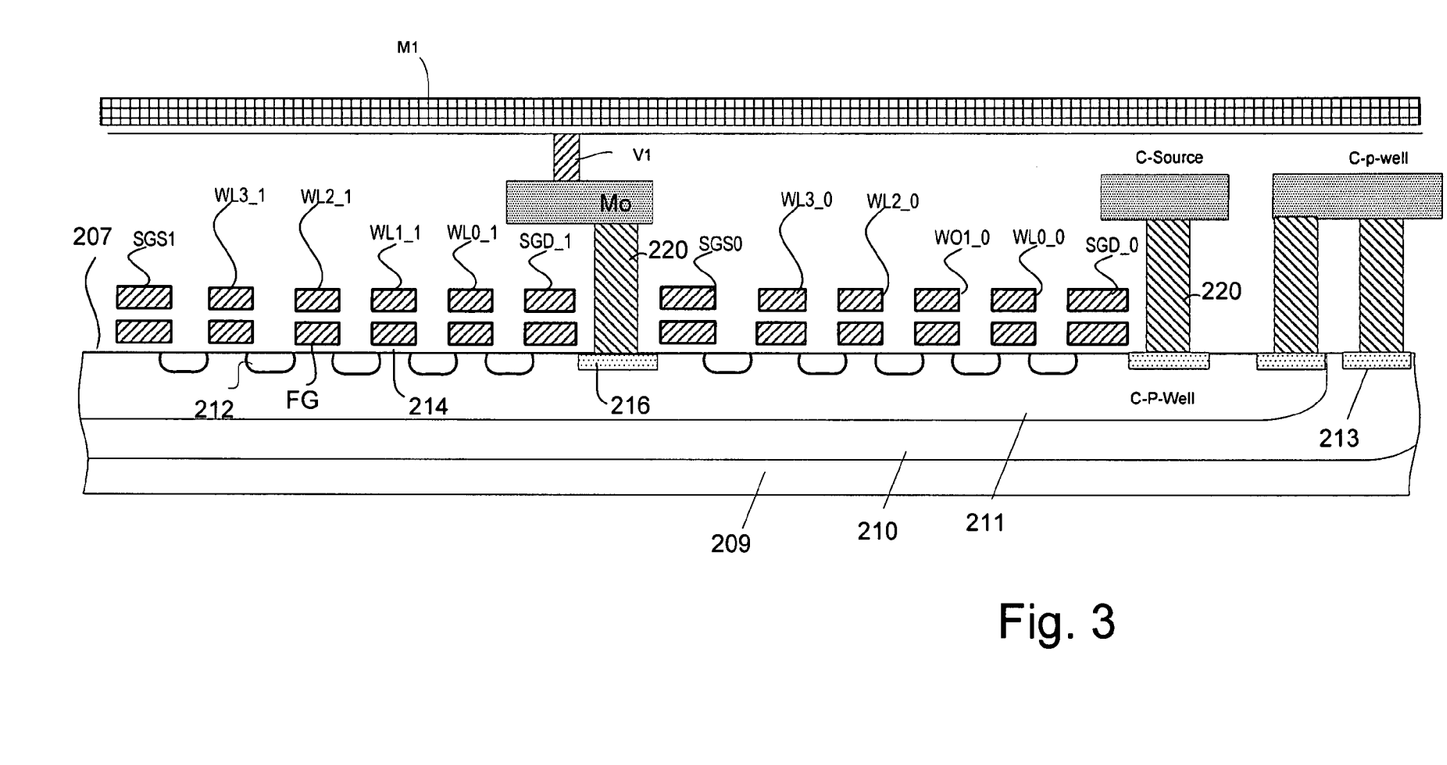
FIG. 3 is a cross sectional view of the NAND string.

FIG. 3 shows a cross sectional view of a NAND cell unit of the type shown schematically in FIG. 2, in the direction of the bit line (BL). At a surface 207 of a p-type semiconductor substrate 209, a p-type region c-p-well 211 is formed, the c-p-well being enclosed by an n-type region 210 to electrically isolate the c-p-well from the p-type substrate. The n-type region 210 is connected to a c-p-well line made of a first metal M0 via a first contact hole 220 and an n-type diffusion layer 216. The p-type region c-p-well 211 is also connected to the c-p-well line via the first contact hole 220 and a p-type diffusion layer 213. The c-p-well line is connected to the c-p-well control circuit 108 (FIG. 1).

Each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (214). The word line (WL) is stacked on the floating gate (FG) via an insulator film (215). (It should be understood that the tunnel oxide film 214 and the insulator layer underlie each of the floating gates and word lines, though not specifically labeled in FIG. 3 for the sake of clarity.) The source electrode is connected to the common source line (c-source) made of the first metal (M0) via the second select transistor (S) and the first contact hole (212). The common source line is connected to the c-source control circuit (110). The drain electrode is connected to the bit line (BL) made of a second metal (M1) via the first select transistor (S), the first contact hole (220), an intermediate wiring of the first metal (M0) and a second contact hole (not shown). The bit line is connected to the column control circuit (124). Each column is isolated from the neighbor columns by a trench formed in the substrate and filled with isolation material, known as a shallow trench isolation (STI). The floating gates (FG) are isolated from each other by the STI and insulator film 15 and word line (WL).

Spacing between adjacent floating gates (FG) decreasing to distances less than 0.1 μm, and capacitive coupling between the floating gates therefore is on the increase. Since the gate electrode (SG) of the select transistor (S) is formed in the same formation process steps as the floating gate (FG) and word line (WL), it shows a stacked gate structure.

During read and programming operations, 4,256 memory cells (or multiples thereof) are simultaneously selected. The memory cells selected have the same word line and the same kind of bit line (e.g. even bit lines). Therefore, 532 bytes of data can be read or programmed simultaneously. These 532 bytes of data that are simultaneously read or programmed form a logical page. Therefore, one block can store at least eight logical pages. In binary mode, each word line is associated with two logical pages: one logical page for even bit lines and one logical page for odd bit lines. When each memory cell stores two bits of data (e.g. a multi-state cell), one block stores 16 pages and each of the word lines is associated with four logical pages: two logical pages for even bit lines and two logical pages for odd bit lines. Other sized blocks can also be used with the present invention.

Figure 4:
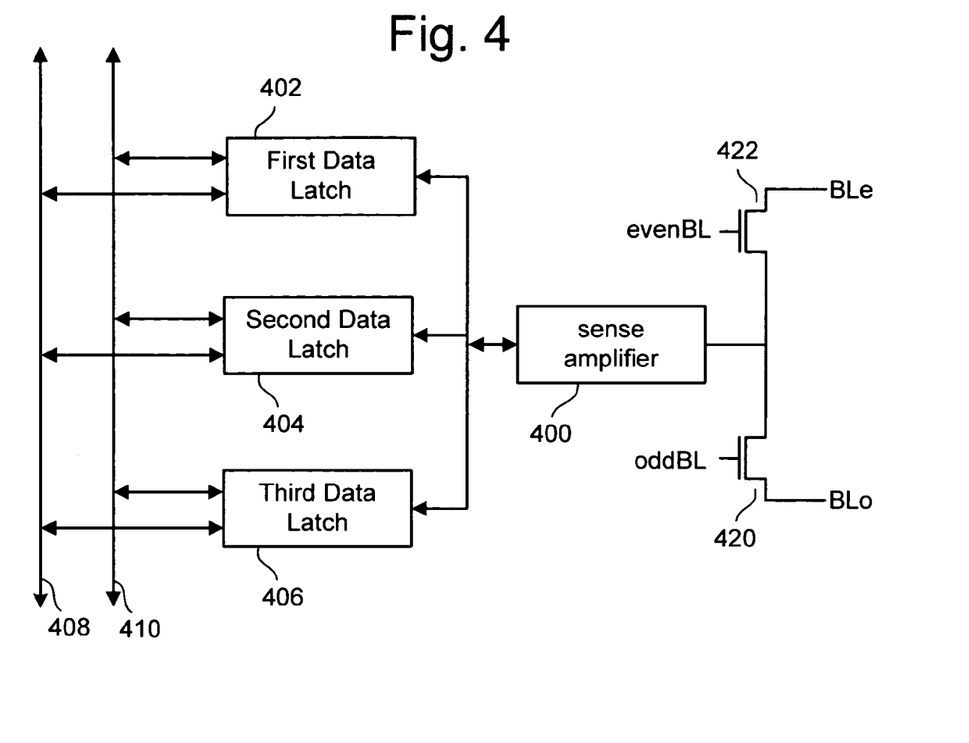
FIG. 4 depicts a block diagram of an example of electrical device that uses a memory according to one embodiment of the present invention.

FIG. 4 depicts a portion of column control circuit 304. Each pair of bit lines (e.g. BLe and BLo) is coupled to a sense amplifier 400. The sense amplifier is connected to three data latches: first data latch 402, second data latch 404 and third data latch 406. Each of the three data latches is capable of storing one bit of data. The sense amplifier senses the potential level of the selected bit line during read or verify operations, stores the sensed data in a binary manner, and controls the bit line voltage during the program operation. The sense amplifier is selectively connected to the selected bit line by selecting one of signals of "evenBL" and "oddBL." Data latches 402, 404 and 406 are coupled to I/O lines 408 to output read data and to store program data. I/O lines 408 are connected to data input/output buffer 312 of FIG. 5. Data latches 402, 404 and 406 are also coupled to status line(s) 410 to receive and send status information. In one embodiment, there is a sense amplifier, first data latch 402, second data latch 404 and third data latch 406 for each pair (even and odd) of bit lines.

Voltages are applied to operate the memory cell array 102 in a manner described in numerous references, including U.S. Pat. No. 6,522,580. In a specific example, each memory cell's floating gate stores two bits, having one of the states "11", "10", "01", "00". An example of a full table of operational voltages is given in U.S. Pat. No. 6,522,580. For example, assuming a word line "WL2" and the bit lines of "BLe" are selected for reading and programming. By raising the c-p-well to an erase voltage of 20 V and grounding the word lines (WL) of a selected block, the data of the selected block is erased. Since all of the word lines (WL) of the unselected blocks, bit lines (BL), select lines (SG) and c-source are put in a floating state, these are also raised to almost 20 V due to a capacitive coupling with the c-p-well. Therefore, a strong electric field is applied to only the tunnel oxide films 214 of the selected memory cells (M), and the data of the selected memory cells are erased as a tunnel current flows across the tunnel oxide film 214. The erased cell is, in this example, one of the four possible programmed states, namely "11".

In order to store electrons in the floating gate (FG) during a programming operation, the selected word line WL2 is connected to a program pulse Vpgm and the selected bit lines BLe are grounded. A strong electric field is applied to only the tunnel oxide films 214 of the memory cells (M) during programming, and the tunnel current flows across the tunnel oxide film 214 in the reverse direction compared to the erase, and then the logical state is changed from "11" to one of the other states "10", "01", or "00". Well known techniques called "self-boosting" techniques are also typically employed to prevent program disturb.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation for a two level memory cell, the selected word line WL2 may be grounded, so that it is detected whether the threshold voltage is higher than 0V. In a verify operation, the selected word line WL2 is connected to 2.4V, for example, so that it is verified whether the threshold voltage has reached at least 2.4V. The source and p-well are at zero volts. The selected bit lines (BLe) are pre-charged to a level of, for example, 0.7V. If the threshold voltage is higher than the read or verify level, the potential level of the concerned bit line (BLe) maintains the high level because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

Figure 5:
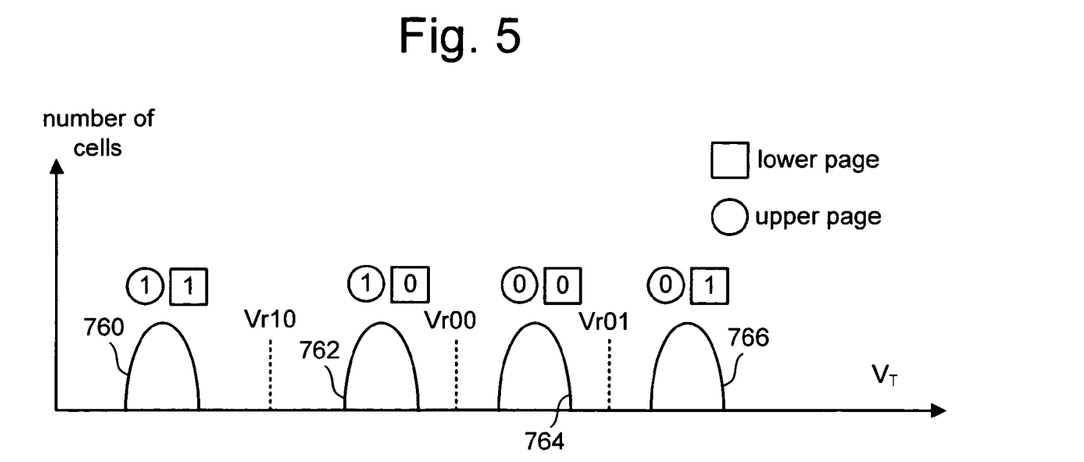
FIG. 5 depicts memory cell threshold distributions and illustrates one example of a technique for programming multi-state memory cells.

FIG. 5 illustrates threshold voltage distributions for the memory cell array 102 when each floating gate storage element stores two bits of data, namely four data states, in each memory cell (M). The curve 760 represents a distribution of the threshold levels $V_T$ of the cells within the array that are in the erased state ("11" data state), being negative threshold voltage levels. Threshold voltage distributions 762 and 764 of memory cells storing "10" and "00" user data, respectively, are shown to be between read voltages Vr10 and Vr00 (which, in one embodiment, may be 0V and 1.2 V, respectively) and between read voltages Vr00 and Vr01 (which may be 1.2 V and 2.2 V). A curve 766 shows the distribution of cells that have been programmed to the "01" data state, being the highest threshold voltage level set more than 2.2 V and less than 4.5 V of the read pass voltage.

During a read operation, voltages corresponding to Vr10, Vr00, and Vr01 are applied to the control gate of a memory cell to determine at what point the memory cell conducts and doesn't conduct. Based on the three read operations, the memory system can determine which threshold distribution (e.g. which state) the memory cell is in. For example, if the memory cell does not conduct for any of the three read operations, the memory cells in state 01. If the memory cell only conducts when applying Vr01 to the control gate, the memory cells in state 00. If the memory cell conducts when applying Vr00 and not when applying Vr10, then the memory cell is in state 10. If the memory cell conducts when applying Vr10, Vr00, and Vr01, then the memory cells in state 11. In one embodiment, each of the read compare points Vr10, Vr00, and Vr01 are midpoints between adjacent states of threshold distributions. One set of examples of read compare points include Vr10=0 volts, Vr00=1.2 volts and Vr01=2.2 volts. However, other values can also be used.

As discussed above, word lines are written sequentially, from word line WL0 to WL63 in a given array. FIG. 5 therefore represents the state of a word line WLn which is written before the next sequential word line WLn+1 is written. That is, all distributions in word line WLn are unaffected by the data in the adjacent, word line (WLn+1) since, in FIG. 5, WLn+1 has not yet been written. Programming of the upper and lower pages of the cell may be accomplished in accordance with one or more write passes, as set forth in U.S. Pat. Nos. 6,522,580 or 6,643,188.

Note that although specific bit patterns have been assigned to each of the distributions, different bit patterns may be so assigned, in which case the states between which programming occurs can be different than those depicted in FIG. 5.

In order to provide improved reliability, it is better for the individual distributions to be tightened (distribution narrowed), because the tighter distribution brings a wider read margin (distance between them). According to the present invention, the distribution width is made tighter without a conspicuous degradation in the programming speed.

Figure 6A:
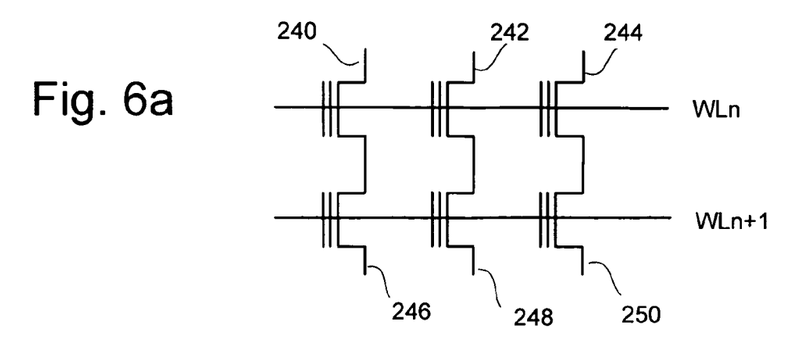
FIG. 6a shows two adjacent word lines WLn and WLn=1.
Figure 6B:
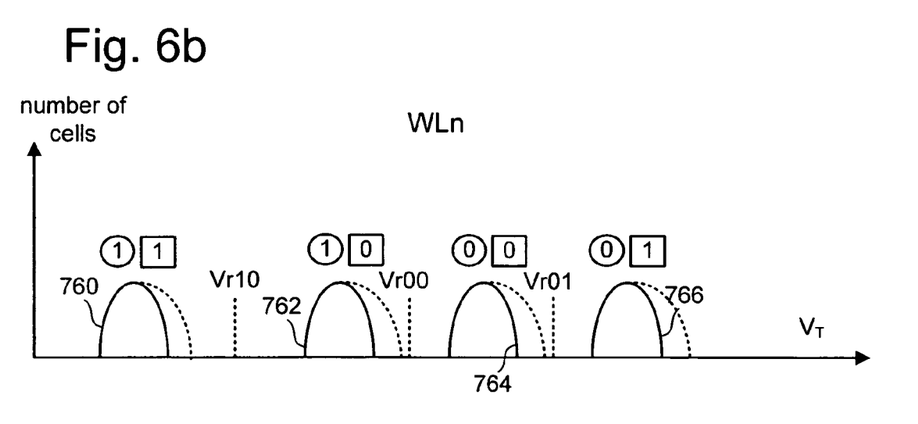
FIGS. 6b and 6c show the Yupin effect on threshold distributions of two adjacent cells in the memory cell array of FIG. 6a when programmed with an existing technique.
Figure 6C:
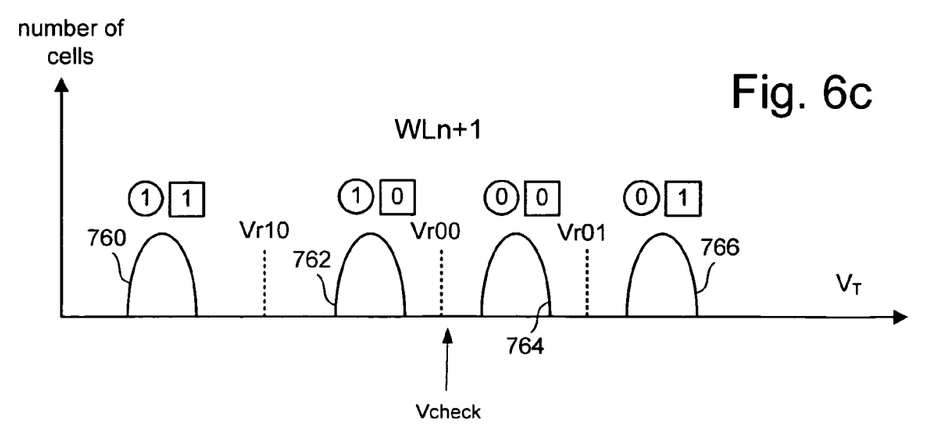

FIG. 6 illustrates six memory cells 240, 242, 244, 246, 248 and 250 of a much larger number of cells along two adjacent word lines WLn and WLn+1. FIG. 6 also shows two distributions for compare points Vr10, Vr00, and Vr01 for the adjacent word lines WLn and WLn+1 at a point after WLn+1 has been written.

In word line WLn, it will be noted that because of the Yupin effect discussed above, the apparent distributions of the "11" and "10" (as shown by the broadening dashed lines states) becomes broader than the threshold distributions indicated by the solid lines that exist immediately after their programming. This is because the initial programming of data of word line WLn is done in an environment where no adjacent floating gates contain the higher charge levels that represent the "00" and "01" states. The broadening of the apparent initial distributions occurs when adjacent cells, such as cells in an adjacent word line WLn+1, are programmed to these higher threshold level states. Further, the higher states "00" and "01" also suffer this apparent broadening effect since adjacent floating gates are written with data.

The effect of this apparent broadening is to place a limit on the number of states in which the memory may be operated, and to create other operational limitations. It requires maintaining a sufficiently large margin between the state distributions so that the broader apparent distributions can be clearly distinguished during data read operations. Only the last word line in the memory array is unaffected by the Yupin effect, since there are no charge levels of the adjacent floating gates which are written after it. The "00" and "01" states of the memory cells are programmed last. For each of the other six states of the cells storing bits from Pages 0, 1, 2, and 3, however, there is subsequent programming of adjacent cells that affects the extent of their apparent threshold voltage distributions because of the field coupling between the floating gates.

Figure 7:
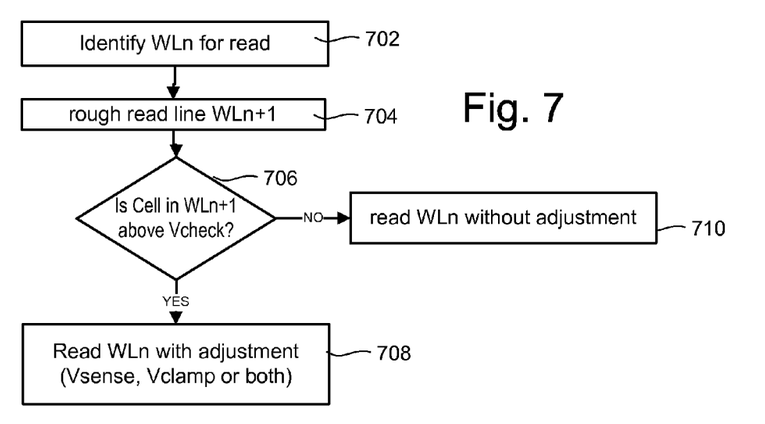
FIG. 7 is a flow chart describing one embodiment of a process for operating memory devices with reduced Read Disturb.

The present invention, therefore, provides a method for reducing the effective width of the distributions illustrated above using an iterative read method. FIG. 7 illustrates the method of the present invention.

In general, for a given word line to be read (WLn) a pre-read of the next word line (WLn+1) occurs, after which, using the data from word line WLn+1, the data from WLn is read. With reference to FIG. 7, at a first step 702, a first word line WLn to be read is identified, and at step 704 a rough read of the adjacent word line is performed. Rough read step 704 is a step only to determine the page 0 contents of the cell. That is, step 704 need only determine whether the data state is above or below a above or below a check point voltage (Vcheck). In one embodiment, only one read at step 704 is made and the check point voltage is set a level of halfway between the normal Vt distribution range as illustrated in FIG. 5. In one embodiment, the Vcheck voltage may be equivalent to the control gate voltage to Vr00; in alternative embodiments, Vcheck is an independent parameter which may be implemented with a separate DAC table in a memory device.

At step 706, all bits above Vcheck in word line WLn+1 are known, and hence all bits having a significant word-line-to-word-line coupling effect on the previous word line WLn are known. If the initial read of WLn+1 determines that a given bit in WLn+1 is above Vcheck, then at step 708, the target cell (in WLn) is read by shifting at least one read parameter. The read parameter may be the pre-charge voltage, the sense voltage, or both. If not, then the cell is read normally. Hence, the method takes advantage of the fact that the write process occurs in a particular order—by successive word liness—so that only succeeding cells have an effect on preceding bit lines.

With the knowledge of which cells have been shifted, the bit line dependent read of step 708 includes compensating the read operation using the known aspects of each technology generation. For a given technology, the amount of the coupling shift which is imparted by adjacent word lines is generally known. For 90 nm technology, if a WLn+1 cell is above Vcheck, then the WLn cell will have its threshold voltage shifted up in a range between 0.15v to 0.3 v. Cells adjacent to WLn+1 cells which are below the Vcheck voltage will have 0v to 0.15v of shift. It will be recognized that these numbers are exemplary and that other technologies will have different voltage ranges. As noted above, during a normal read, selected bit lines (BLe) are pre-charged to a level of, for example, 0.7V. In accordance with the present invention, for an adjusted bit line, the pre-charge voltage would be lower. In one embodiment of the invention, the amount of the shift is a fraction of the total Yupin effect, and in one particular embodiment, this fraction is one-half. Hence, in the case of 70 nm technology described above, one-half the total possible shift of 0.3 volts, is 0.15 volts. Alternatively, the sense threshold below which the potential level of the concerned bit line (BLe) is allowed to decrease before being considered without data is raised relative to the pre-charge voltage. In either case, the resulting distribution will be improved by reducing the effective width by one-half.

Figure 8A:
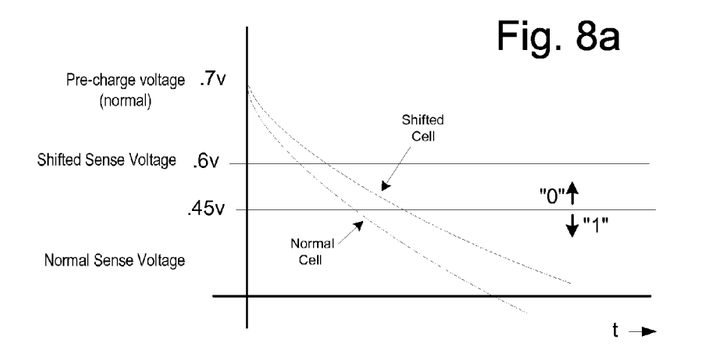
FIGS. 8a and 8b are graphs illustrating the charge read in a shifted word line reads preformed in accordance with the present invention relative to non-shifted reads.
Figure 8B:
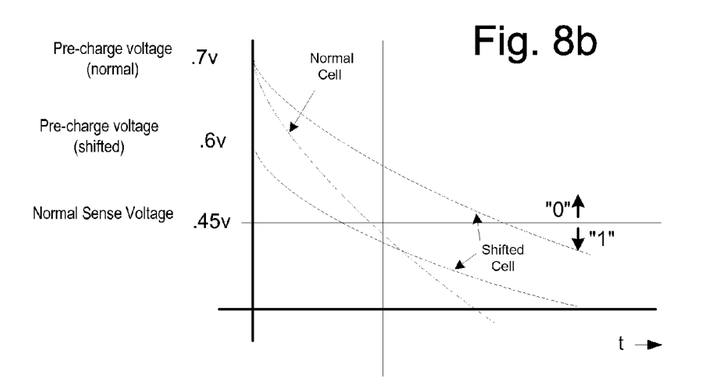
Figure 9:
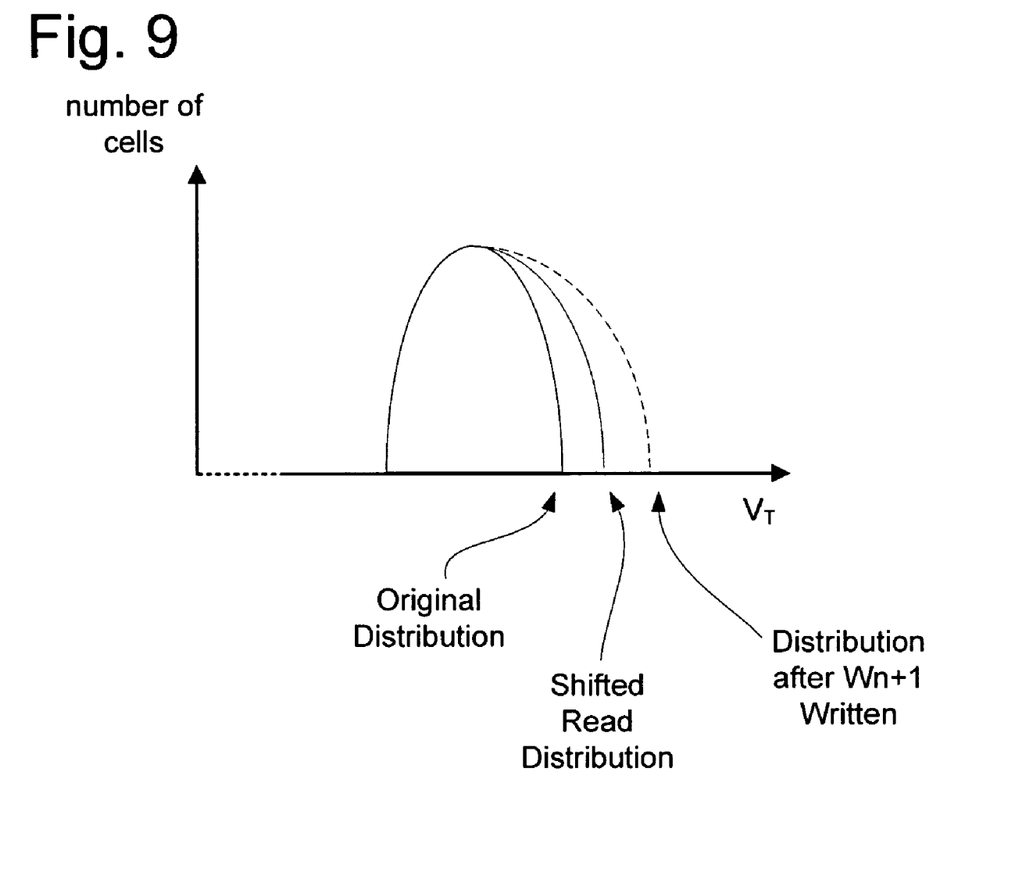
FIG. 9 is a graph illustrating an ideal distribution, a worst-case Yupin shifted distribution and an effective distribution in accordance with the present invention.

This shift is illustrated in FIGS. 8a and 8b. In FIG. 8, the effect of shifting the sense voltage is shown. The decay of the pre-charge voltage over time for a Yupin-shifted cell is illustrated relative to a typical sense voltage. At the measurement point R, the cell's threshold voltage is measured by the sense amplifier as described above. In the example of FIG. 8a, were no Yupin effect occurring, the cell should have read "1". However, due to the word-line-to-word-line coupleing, using a normal 0.45v threshold would yield an error. By shifting the sense voltage up to 0.6, the correct result is obtained. Likewise, in FIG. 8b, a shifted down pre-charge voltage of 0.6v volts and a typical sense voltage of 0.45 v would likewise yield the correct result. In accordance with a first embodiment of the invention, if the read at step 706 determines a shift is required for WLn, then a pre-charge voltage may be shifted down, or the sense voltage up, by an amount which in one embodiment is one-half of the expected worst-case Yupin shift (0.15v for 70 nm technology). In a further embodiment, both the sense voltage and the pre-charge voltage may be partially shifted. The value of one-half is chosen so that the effective distribution of the shift is reduced by one-half. Other values may be chosen. FIG. 9 illustrates this shift in the distribution relative to the ideal distribution and the worst case distribution.

In yet a further embodiment, additional word line reads of WLn+1 may be provided to determine the exact amount of the Yupin effect. In the previous embodiments two assumptions are made: only those bits (01 and 00) above the check voltage will be used for compensation, and only one-half of the worst-case shift amount is used. These assumptions are made to reduce the WLn+1 bit line read to a single read step. For greater accuracy, three reads on bit line WLn+1 may be used instead of one. That is, three reads of WLn+1 may be made to determine the exact charge values of the bits on WLn+1, and the shift amounts may then be adjusted more precisely. For example, if three reads are used on WLn+1 to determine that a (00) value is adjacent to the cell to be read, the full shift amount (0.3v in the previous examples) may be used.

Figure 10A:
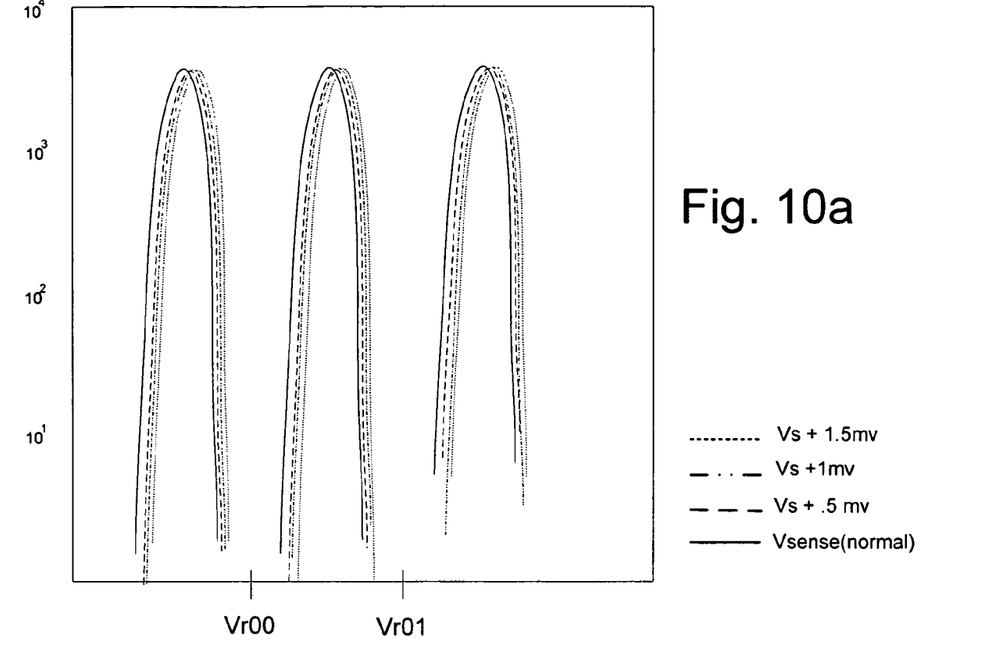
FIGS. 10a and 10b are graphs of distributions for shifted sense and pre-charge voltages, respectively.
Figure 10B:
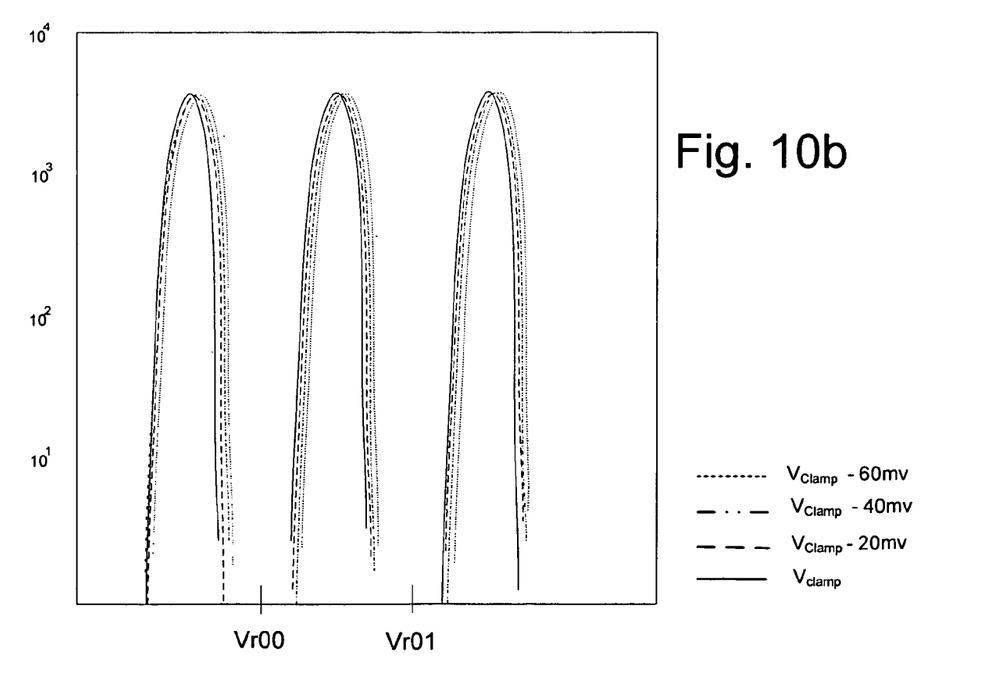

FIGS. 10a and 10b illustrate the shift of measured threshold voltage distribution as a function of the sense voltage and the pre-charge voltage, respectively. In FIG. 10a, the distribution for all cells greater than 1,1 is shown with the sense voltage incremented at 0.5v intervals. In FIG. 10b, the pre-charge voltage is decremented in 20 mv increments. As shown therein, the shift of the distributions is proportional to the shift in the clamp or sense voltages.

Figure 11A:
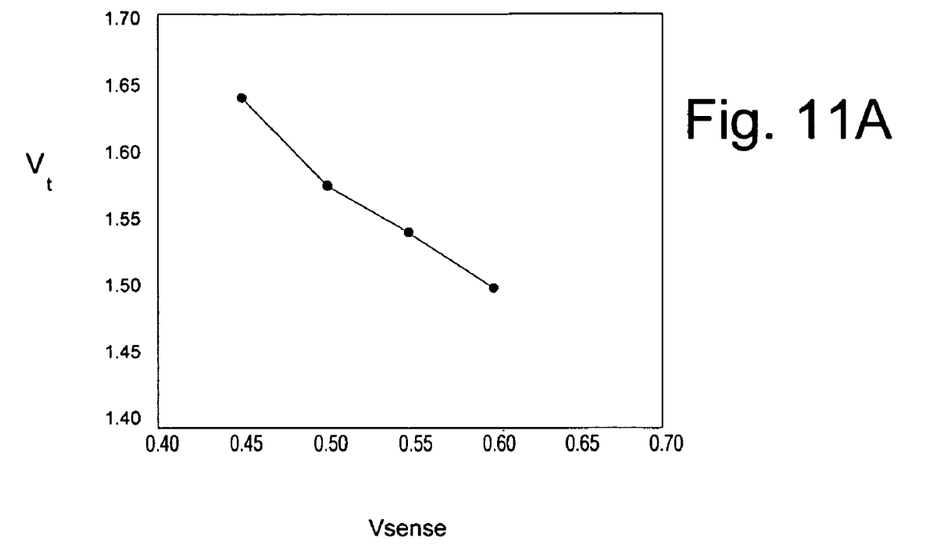
FIGS. 11a and 11b are graphs of the threshold voltage versus sense and pre-charge voltages, respectively.
Figure 11B:
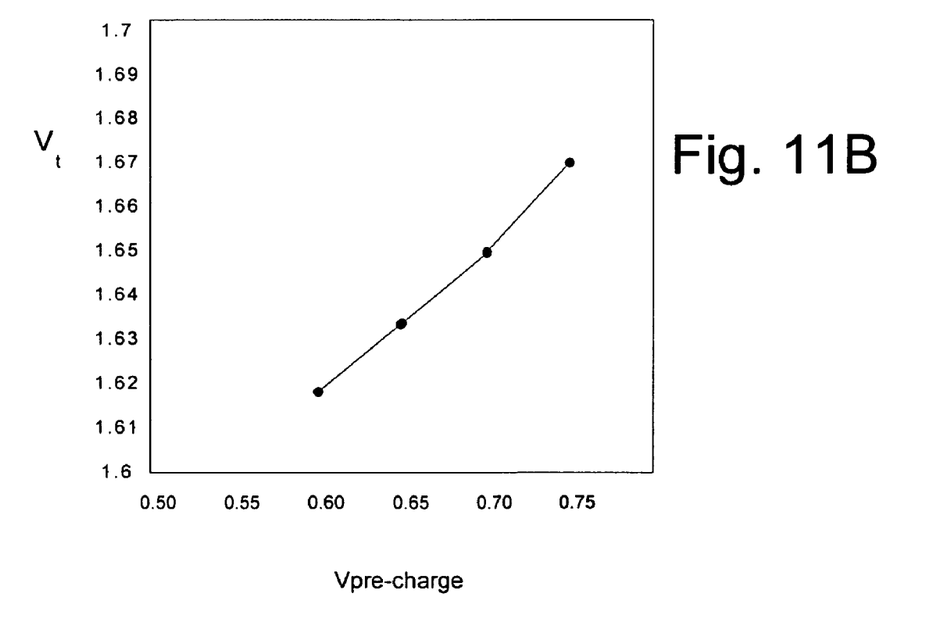

This relationship is further illustrated in FIGS. 11a and 11b, showing the sense voltage and pre-charge clap voltage shifts relative to the threshold voltage. As shown in FIG. 11a, as the sense voltage is increased, the threshold voltage measurement is decreased. Likewise, for lower pre-charge voltages, the threshold voltage measurement is lower.

In addition, as noted above, because the last word line in the array is not effected by a subsequently written word line, this method need not be performed on the last word line in the array.

The foregoing detailed description of the invention has been presented for purposes of illustration and description. It is not intended to be exhaustive or to limit the invention to the precise form disclosed. The principles of the present invention have application to various types of non-volatile memories, those currently existing and those contemplated to use new technology being developed. Implementations of the present invention, however, are described with respect to a flash electrically-erasable and programmable read-only memory (EEPROM), wherein the storage elements are floating gates. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method for reading a non-volatile memory arranged in columns and rows, comprising the steps of:
    selecting a word-line WLn to be read;
    reading an adjacent word line (WLn+1) written after word line WLn;
    determining whether the adjacent word line has a threshold voltage greater than a check voltage; and
    if the data state of the adjacent word line is above the check voltage, reading a selected bit in word line WLn by selectively adjusting at least a pre-charge voltage.

2. The method of claim 1 wherein the step of reading a selected bit in word line WLn further includes adjusting a sense voltage.

3. The method of claim 2 wherein the step of reading the selected bit includes increasing the sense voltage.

4. The method of claim 3 wherein the step of increasing the sense voltage includes increasing the sense voltage by an amount equal to a fraction of the maximum coupling effect of the adjacent bit on the selected bit.

5. The method of claim 4 wherein the fraction is one-half.

6. The method of claim 1 wherein the step of reading the selected bit includes decreasing the pre-charge voltage.

7. The method of claim 6 wherein the step of decreasing the pre-charge voltage includes decreasing the pre-charge voltage by an amount equal to a fraction of the maximum coupling effect of the adjacent bit on the selected bit.

8. The method of claim 1 wherein the check voltage is one half of a threshold voltage distribution.

9. The method of claim 1 wherein the bits hold a multi-state memory, the step of reading an adjacent word line includes determining the threshold voltage state of the bit.

10. The method of claim 9 wherein the step of reading an adjacent word line includes reading the bit at least three times.

11. The method of claim 10 wherein the step of reading the selected bit in the word line further includes decreasing a sense voltage by an amount equal to a coupling effect of the adjacent bit on the selected bit.

12. The method of claim 10 wherein the step of reading the selected bit includes increasing the pre-charge voltage by an amount equal to a coupling effect of the adjacent bit on the selected bit.

13. A method for reading a non-volatile memory arranged in columns and rows, comprising the steps of:
    determining a selected bit to be read in a first word-line;
    reading an adjacent word line written afire the first word line;
    determining whether a bit adjacent to the selected bit has a threshold voltage greater than a check voltage; and
    if the adjacent bit has a threshold voltage greater than the check voltage, reading the selected bit in said first word line by selectively adjusting at least a pre-charge voltage.

14. The method of claim 13 wherein the step of reading the selected bit in the first word line further includes adjusting a sense voltage.

15. The method of claim 14 wherein the step of reading the selected bit includes increasing the sense voltage.

16. The method of claim 15 wherein the step of increasing the sense voltage includes increasing the sense voltage by an amount equal to one-half of the maximum coupling effect of the adjacent bit on the selected bit.

17. The method of claim 16 wherein the step of reading the selected bit in the first word line includes decreasing the pre-charge voltage.

18. The method of claim 17 wherein the step of decreasing the pre-charge voltage includes decreasing the pre-charge voltage by an amount equal to one-half of the maximum coupling effect of the adjacent bit on the selected bit.

19. The method of claim 13 wherein the check voltage is one half of a threshold voltage distribution of a multi-state cell array.

20. A memory system including a code enabling reading data from the system, comprising:
    an array of multi-state memory cells arranged in rows and columns;
    a controller coupled to the array for executing said code, the code performing the steps of:
    determining a selected bit to be read in a first row-line;
    reading an adjacent row line written after the first row line;
    determining whether a bit adjacent to the selected bit has a threshold voltage greater than a check voltage; and
    if the adjacent bit has a threshold voltage greater than the check voltage, reading the selected bit in the first row line by selectively adjusting at least a pre-charge voltage.

21. The system of claim 20 wherein reading the selected bit in the first row line further includes adjusting a sense voltage.

22. The system of claim 21 wherein the step of reading the selected bit includes increasing the sense voltage.

23. The system of claim 20 wherein the step of reading the selected bit includes decreasing the pre-charge voltage.

24. The system of claim 20 wherein the step of reading the selected bit includes adjusting both the pre-charge voltage and a sense voltage.

25. The system of claim 20 wherein the check voltage is one half of a voltage threshold distribution of the multi-state cell array.

* * * * *